(12) United States Patent
Wang et al.

(10) Patent No.: US 10,873,047 B2
(45) Date of Patent: Dec. 22, 2020

(54) QUANTUM DOT LIGHT-EMITTING DIODE DEVICES AND MANUFACTURING METHODS, APPARATUSES THEREOF

(71) Applicants: Kunshan New Flat Panel Display Technology Center Co., Ltd., Kunshan (CN); KunShan Go-Visionox Opto-Electronics Co., Ltd., Jiangsu (CN)

(72) Inventors: Jiantai Wang, Jiangsu (CN); Rubo Xing, Jiangsu (CN); Xiaolong Yang, Jiangsu (CN); Huimin Liu, Jiangsu (CN); Ping Sun, Jiangsu (CN); Dong Wei, Jiangsu (CN)

(73) Assignees: KUNSHAN NEW FLAT PANEL DISPLAY TECHNOLOGY CENTER CO., LTD., Kunshan (CN); KUNSHAN GO-VISIONOX OPTO-ELECTRONICS CO., LTD., Kunshan (CN)

( * ) Notice: Subject to any disclaimer, the term of this patent is extended or adjusted under 35 U.S.C. 154(b) by 0 days.

(21) Appl. No.: 16/419,176

(22) Filed: May 22, 2019

(65) Prior Publication Data

US 2019/0280234 A1  Sep. 12, 2019

Related U.S. Application Data

(63) Continuation of application No. PCT/CN2018/088754, filed on May 28, 2018.

(30) Foreign Application Priority Data

Jan. 31, 2018  (CN) .......................... 2018 1 0097394

(51) Int. Cl.
*H01L 51/50* (2006.01)
*H01L 51/00* (2006.01)
*H01L 51/56* (2006.01)

(52) U.S. Cl.
CPC ........ *H01L 51/502* (2013.01); *H01L 51/0007* (2013.01); *H01L 51/5056* (2013.01); *H01L 51/5072* (2013.01); *H01L 51/56* (2013.01)

(58) Field of Classification Search
CPC ... H01L 51/502; H01L 51/0007; H01L 51/56; H01L 51/5072; H01L 51/5056; H01L 2251/5369
See application file for complete search history.

(56) References Cited

U.S. PATENT DOCUMENTS

| 2011/0284825 A1 | 11/2011 | Yang et al. |
| 2014/0061593 A1 | 3/2014 | Liu, Jr. et al. |
| 2017/0141336 A1 | 5/2017 | Zhou et al. |

FOREIGN PATENT DOCUMENTS

| CN | 102017217 A | 4/2011 |
| CN | 103474484 A | 12/2013 |

(Continued)

OTHER PUBLICATIONS

Qasim Khan et al. (CN publication 105609651 A, English machine translation) (Year: 2016).*

(Continued)

*Primary Examiner* — Mohammed R Alam

(74) *Attorney, Agent, or Firm* — Ladas & Parry LLP

(57) ABSTRACT

The disclosure relates to a quantum dot light-emitting diode device and a manufacturing method and an apparatus thereof, which are used to alleviate the problem of interface quenching caused by the large density of the defect state of nanoparticles of the electron transport layer in the prior art. The method includes: dissolving a polyelectrolyte and nanoparticles having inorganic semiconductor properties to form a first mixed solution; depositing the first mixed solution on one surface of the formed quantum dot light-emitting layer to form an electron transport layer containing the polyelectrolyte and the nanoparticles. The end groups (Continued)

carried by at least a portion of the polyelectrolyte are capable of filling surface defects of the nanoparticles in the electron transport layer.

9 Claims, 3 Drawing Sheets

(56) References Cited

FOREIGN PATENT DOCUMENTS

| CN | 105047821 A | 11/2015 |
|---|---|---|
| CN | 105140411 A | 12/2015 |
| CN | 105280826 A | 1/2016 |
| CN | 105457677 A | 4/2016 |
| CN | 105609651 A | 5/2016 |
| CN | 106784348 A | 5/2017 |
| CN | 106935719 A | 7/2017 |
| CN | 107331781 A | 11/2017 |
| CN | 107492587 A | 12/2017 |
| CN | 107603340 A | 1/2018 |
| TW | 201119082 A1 | 6/2011 |
| TW | 201539781 A | 10/2015 |
| WO | 2017/128551 A1 | 8/2017 |

OTHER PUBLICATIONS

Search Report corresponding to Chinese Patent Application No. 201810097394.5.
CN 106784348 A _ Espacenet English Abstract.
CN 103474484 A _ Espacenet English Abstract.
CN 105609651 A _ Espacenet English Abstract.
CN 105140411 A _ Espacenet English Abstract.
CN 105457677 A _ Espacenet English Abstract.
Shuyan Shao, et al., "Enhanced Performance of Inverted Polymer Solar Cells by Using Poly (ethylene oxide)—Modified ZnO as an Electron Transport Layer", ACS Appl. Mater. Interfaces, 2013, 5, 380-385.
Office Action & Search Report corresponding for TW 107123745.
TW 201119082 A1 _ Espacenet English Abstract.
TW 201539781 A _ Espacenet English Abstract.
CN 107492587 A _ Espacenet English Abstract.
CN 107331781 A _ Espacenet English Abstract.
CN 106935719 A _ Espacenet English Abstract.
International Search Report in International Application No. PCT/CN2018/088754.
CN 107603340 A _ Espacenet English Abstract.
CN 102017217 A _ Espacenet English Abstract.
CN 105280826 A _ Espacenet English Abstract.
CN 105047821 A _ Espacenet English Abstract.

* cited by examiner

US 10,873,047 B2

QUANTUM DOT LIGHT-EMITTING DIODE DEVICES AND MANUFACTURING METHODS, APPARATUSES THEREOF

CROSS REFERENCE

This application is a continuation of International Application No. PCT/CN2018/088754, filed on May 28, 2018, which claims priority to Chinese Patent Application No. 201810097394.5, entitled "QUANTUM DOT LIGHT-EMITTING DIODE DEVICES AND MANUFACTURING METHODS, APPARATUSES THEREOF" filed on Jan. 31, 2018, the contents of which are expressly incorporated by reference herein in their entireties.

FIELD OF THE DISCLOSURE

The disclosure relates to the field of light-emitting technology, and in particular to quantum dot light-emitting diode devices and manufacturing methods, apparatuses thereof.

BACKGROUND

Quantum Dot Light-Emitting Diodes (QLEDs) are new type of self-luminous technology that requires no additional light source. Quantum Dots are invisible to the naked eye and extremely small semiconductor nanocrystals. The particle diameter ranges between a few nanometers and tens of nanometers.

As shown in FIG. 1, FIG. 1 is a schematic structural diagram of a film layer in the existing QLED device. The film layer of the device sequentially mainly includes from top to bottom a cathode 11, an electron transport layer 12, a quantum dot light-emitting layer 13, a hole transport layer 14, an anode 15 and the like. Further, an electron injection layer, a hole injection layer and the like may also be included, which is not shown in FIG. 1.

SUMMARY

Exemplary embodiments of the disclosure provide a quantum dot light-emitting diode device and a manufacturing method and an apparatus thereof, which are used to alleviate the problem of interface quenching in the electron transport layer caused by the larger density of the defect state of the electron transport layer containing nanoparticles in the prior art.

The exemplary embodiments of the disclosure use the following technical solutions:

a method of manufacturing a quantum dot light-emitting diode device, comprising:

dissolving a polyelectrolyte and nanoparticles having inorganic semiconductor properties to form a first mixed solution;

depositing the first mixed solution on one surface of a formed quantum dot light-emitting layer to form an electron transport layer containing the polyelectrolyte and the nanoparticles;

wherein end groups carried by at least a portion of the polyelectrolyte are capable of filling surface defects of the nanoparticles in the electron transport layer.

Preferably, the method further comprises: dissolving a polymer and nanoparticles having inorganic semiconductor properties to form a second mixed solution;

depositing the second mixed solution on the other surface of the formed quantum dot light-emitting layer to form a hole transport layer containing the polymer and the nanoparticles.

Preferably, the dissolving a polyelectrolyte and nanoparticles having inorganic semiconductor properties to form a first mixed solution specifically comprises: dissolving the polyelectrolyte with a first solvent to obtain a first solution;

dissolving the nanoparticies having inorganic semiconductor properties with a second solvent to obtain a second solution;

mixing the first solution with the second solution to form the first mixed solution.

Preferably, in the above method, the first solvent is mutually miscible with the second solvent.

Preferably, in the above method, the first solvent and the second solvent are a same solvent.

Preferably, in the above method, the concentration of the polyelectrolyte in the first mixed solution is less than 1 mg/ml, the concentration of the nanoparticies in the first mixed solution is greater than or equal to 15 mg/ml and less than or equal to 25 mg/ml.

Preferably the dissolving a polymer and nanoparticles having inorganic semiconductor properties to form a second mixed solution specifically comprises:

dissolving the polymer with a third solvent to obtain a third solution;

dissolving the nanoparticles having inorganic semiconductor properties with a fourth solvent to obtain a fourth solution;

mixing the third solution with the fourth solution to form the second mixed solution.

Preferably, in the above method, the third solvent is mutually miscible with the fourth solvent.

Preferably, in the above method, the third solvent and the fourth solvent are a same solvent.

Preferably, in the above method, the concentration of the polymer in the second mixed solution is less than 1 mg/ml, the concentration of the nanoparticles having inorganic semiconductor properties in the second mixed solution is greater than or equal to 15 mg/ml and less than or equal to 25 mg/ml.

A quantum dot light-emitting diode device, comprising: a quantum dot light-emitting layer, an electron transport layer located on one surface of the quantum dot light-emitting layer, the electron transport layer comprising a polyelectrolyte and nanoparticles having inorganic semiconductor properties;

end groups carried by at least a portion of the polyelectrolyte being capable of filling surface defects of the nanoparticles in the electron transport layer.

Preferably, the polyelectrolyte in the electron transport layer is net-shaped and wraps around the nanoparticles in the electron transport layer.

Preferably, the device further comprising a hole transport layer located on the other surface of the quantum dot light-emitting layer, the hole transport layer containing a polymer and nanoparticles having inorganic semiconductor properties.

A quantum dot light-emitting diode apparatus comprises any one of the above devices.

The following beneficial effects can be achieved by at least one technical solution adopted by the exemplary embodiments of the disclosure.

By the above technical scheme, the disclosure utilizes a polyelectrolyte and nanoparticies having inorganic semiconductor properties to form an electron transport layer, wherein the polyelectrolyte has a chain structure, the end group thereof has a dipole, and the end group of the polymer can be electrically connected to surface defects of the nanoparticles under the action of the electrode, thereby making up for the surface defect of the nanoparticles, reducing the density of the defect state of the electron transport layer, avoiding the occurrence of interface quenching, and further improving the performance of the QLED device. In addition, since the above polymer has a chain structure, a plurality of chain polymer electrolytes form a network structure, and wrap around the nanoparticies in the electron transport layer, thereby effectively limiting the nanoparticles, avoiding the mutual solubility of layers between the electron transport layer and the adjacent film layer, ensuring the performance of the film layer, and further ensuring the light-emitting performance of the QLED device.

BRIEF DESCRIPTION OF THE DRAWINGS

The drawings described herein are provided for further understanding the disclosure and as a part of the disclosure. The exemplary embodiments of the disclosure and description thereof are used to explain the disclosure and not as any improper limitation to the disclosure. In the drawings.

DETAILED DESCRIPTION OF PREFERRED EXEMPLARY EMBODIMENTS

Since a transition metal oxide (such as zinc oxide, titanium oxide) has excellent visible light transmittance and, work function adjustability, the transition metal oxide is a preferred material for the electron transport layer in the quantum dot light-emitting diode. However, there are certain defects on the surface of the above-mentioned nanoparticles, and the defects have electrical properties. When the density of the defects present in the electron transport layer is larger, the surface defects of the nanoparticles would trap electrons, thereby hindering the electrons from flowing into a quantum dot light-emitting layer from a cathode. Therefore, the defect cause interface quenching in the electron transport layer, reducing electron conduction efficiency and affecting the performance and lifetime of the quantum dot light-emitting diode device.

Technical solutions of the disclosure will be clearly and completely described below with reference to the specific exemplary embodiments and the corresponding drawings. Based on the exemplary embodiments in the disclosure, all the other exemplary embodiments obtained by a person skilled in the art without paying creative work will fall into the protection scope of the disclosure.

The schematic structural views of the film layers provided by exemplary embodiments of the disclosure only show the positional relationship between different film layers, and do not represent the actual thickness of the film layers. The serial number of each step in exemplary embodiments of the disclosure does not represent the order by which the steps are performed, but based on the exemplary embodiments in the explanation of the specification and the drawings of the specification.

Exemplary Embodiment 1

Figure 1:
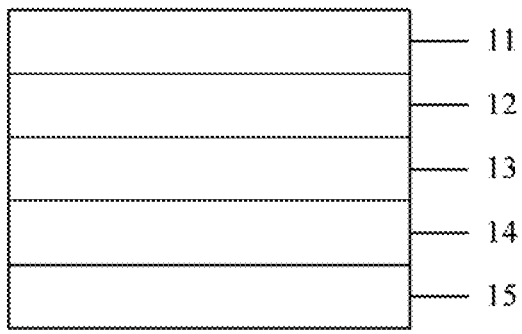
FIG. 1 is a schematic structural diagram of a film layer of a quantum dot light-emitting diode in the prior art.
Figure 2:
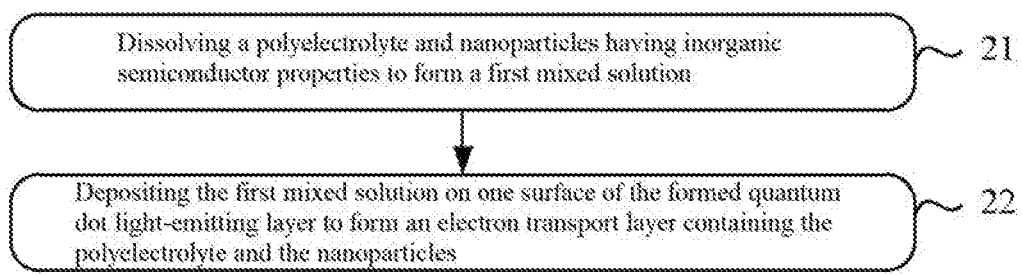
FIG. 2 is a first flowchart of a method for manufacturing a QLED device provided by an exemplary embodiment of the disclosure.

An exemplary embodiment of the disclosure provides a method for manufacturing a quantum dot light-emitting diode device. As shown in FIG. 2, the method includes:

Step 21: dissolving a polyelectrolyte and nanoparticles having inorganic semiconductor properties to form a first mixed solution.

In the disclosure, the polyelectrolyte is also referred to as a polymer electrolyte, is a long-chain polymer with an ionizable group, is chain-like and has an ionizable end group. An alcohol solvent or other solvents having similar properties may be used to dissolve the polyelectrolyte and nanoparticles having inorganic semiconductor properties, and the dissolution process may be accelerated by stirring, heating and the like, and the resulting mixed solution contains the above polymers and nanoparticles. The nanoparticles may be a transition metal oxide such as zinc oxide or titanium oxide.

Step 22: depositing the first mixed solution on one surface of a formed quantum dot light-emitting layer to form an electron transport layer containing the polyelectrolyte and the nanoparticles.

Wherein the end groups carried by at least a portion of the polyelectrolytes are capable of filling surface defects of the nanoparticles in the electron transport layer.

Before the step, the method further includes the steps of providing a substrate and sequentially forming film layers such as an electrode layer on the substrate. The deposition process involved in the step may specifically include coating, dip coating, spraying, printing and the like. After depositing the mixed solution, in order to accelerate the film-forming effect, the solvents may be evaporated by heating, drying, etc., so that after evaporation, the polymer and the nanoparticles wound and wrapped by polymerization are only retained in the film layer to form the electron transport layer.

In the exemplary embodiment, since the ionizable end group of the polyelectrolyte has a dipole enable to be electrically connected to the defect on the surface of the nanoparticle, the end groups carried by at least a portion of the polyelectrolytes are capable of filling the surface of the nanoparticle, reducing the density of the defect state of the electron transport layer, alleviating the electron capture by the surface defects of the nanoparticle in the electron transport layer and avoiding the interface quenching phenomenon.

In addition, the above electron transport layer formed may include not only the polyelectrolyte and the nanoparticles described above, but also other organic or inorganic materials capable of compensating for surface defects of the nanoparticles and reducing the density of the defect state in the electron transport layer, in order to further improve the conductive property of the electron transport layer.

Exemplary Embodiment 2

Based on the above scheme, an exemplary embodiment of the disclosure provides a preferable method for manufacturing a quantum dot light-emitting diode device, the method comprising:

Step 21: dissolving a polyelectrolyte and nanoparticles having inorganic semiconductor properties to form a first mixed solution.

Figure 3:
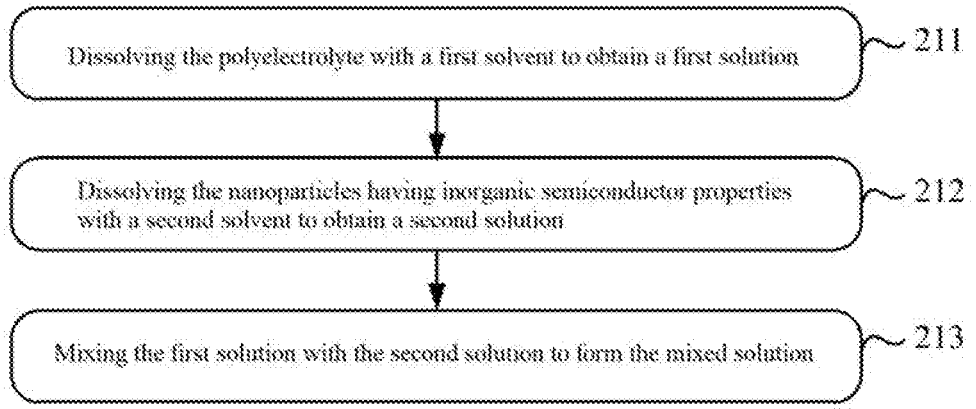
FIG. 3 is a flowchart of the specific method of step 21 in an exemplary embodiment of the disclosure.

For the above step 21, the following dissolving manners can be specifically used:

With reference to FIG. 3, the polymer and the nanoparticles are separately dissolved by using two different solvents, and then mixed, and the following steps are specifically referred to:

Step 211: dissolving the polyelectrolyte with a first solvent to obtain a first solution.

In the actual production process, the first solvent can be selected according to the performance of the selected polyelectrolyte. The first solvent is often capable of dissolving the selected polyelectrolyte and is generally immiscible with the solvent employed in preparing the quantum dot light-emitting layer. In addition, given that the first solution and a second solution are subsequently mixed to, form the mixed solution, the selected first solvent should be miscible with a second solvent so that the formed mixed solution does not delaminate, thereby avoiding solute precipitation phenomenon. Since the quantum dot light-emitting layer usually employs a non-polar solvent, the preferable first solvent dissolving the above polymer is a polar solvent.

Step 212: dissolving the nanoparticles having inorganic semiconductor properties with the second solvent to obtain the second solution.

The nanoparticles are usually inorganic semiconductor nanoparticles, and may specifically select transition metal oxides such as zinc oxide and titanium oxide. The second solvent may be, selected according to performances of the actually selected nanoparticle material, and is often capable of dissolving the above nanoparticles and usually immiscible with the solvent used in the preparation of the quantum dot light-emitting layer. In addition, given that the first solution and the second solution are subsequently mixed to form the mixed solution, the selected second solvent should be miscible with the first solvent so that the formed mixed solution does not delaminate, thereby avoiding solute precipitation phenomenon. Since the quantum dot light-emitting layer usually employs a non-polar solvent, the preferable second solvent dissolving the above polymer is a polar solvent.

Step 213: mixing the first solution with the second solution to form the mixed solution.

Preferably, the first solution and the second solution use polar solvents, thus the first solution is mutually miscible with the second solution. The first mixed solution obtained by mixing the above first solution with the second solution simultaneously contains the chain-like polyelectrolyte and nanoparticles.

In the above solution, orders of step 211 and step 212 are not limited, and step 212 may be performed first and then step 211, or step 211 and step 212 may be performed simultaneously, as long as the first solution and the second solution can be obtained. Separately dissolving the polyelectrolyte and the nanoparticles using the above two solvents can avoid mutual interference when the two substances are dissolved in the same solution, and ensure that the above two substances can be well dissolved in the first mixed solution, thereby reducing the precipitation phenomenon after mixing and ensuring the stability of the amount of the solute in the first mixed solution.

In addition, in order to simplify the manufacturing process a same solvent may be used to dissolve the polymer and the nanoparticles to form the first mixed solution. Specifically, a single solvent capable of simultaneously dissolving the polyelectrolyte and the nanoparticles can be used to dissolve the above substances, thereby ensuring that the polyelectrolyte and the nanoparticles can coexist in the formed solution, and the solvent is usually a polar solvent, thereby ensuring that the solvent is mutually immiscible with the non-polar solvent used in the preparation of the quantum dot light-emitting layer and ensuring the integrity of the electron transport layer and the quantum dot light-emitting layer, and alleviating the mutually solubility phenomenon between layers.

Preferably, for the above scheme, the concentration of the polyelectrolyte in the first mixed solution is less than 1 mg/ml, and the concentration of the nanoparticles in the first mixed solution is greater than or equal to 15 mg/ml and less than or equal to 25 mg/ml. At this concentration, electrically charged end groups of the polyelectrolyte can be better electrically connected to defects on the surface of the nanoparticles, making up for the defects on the surface of the nanoparticles, reducing the density of the defect state in the electron transport layer and avoiding the interface quenching phenomenon. At the same time, since the conductivity of the polyelectrolyte is often inferior to that of the nanoparticle, in order to ensure the conductivity of the electron transport layer, the above concentration used can reduce the influence of the polyelectrolyte on the electron conduction, and ensure better conductivity of the electron transport layer.

Step 22: depositing the first mixed solution on a surface of a formed quantum dot light-emitting layer to form an electron transport layer containing the polyelectrolyte and the nanoparticles.

Figure 4:
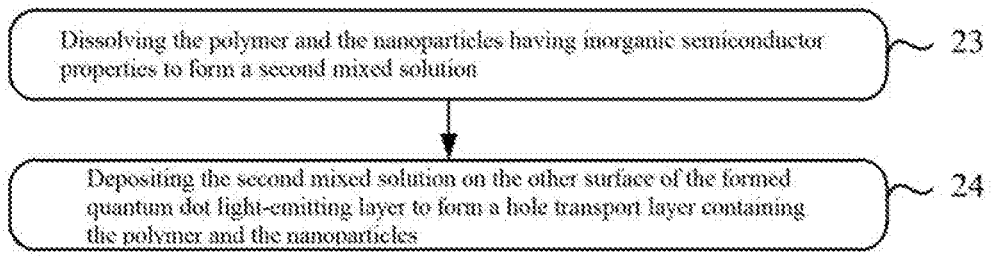
FIG. 4 is a second flowchart of a method for manufacturing a QLED device provided by an exemplary embodiment of the disclosure.

Based on the above scheme, in the process of manufacturing a quantum dot light-emitting diode device, with reference to FIG. 4, the following steps are also included:

Step 23: dissolving a polymer and nanoparticles having inorganic semiconductor properties to form a second mixed solution.

Figure 5:
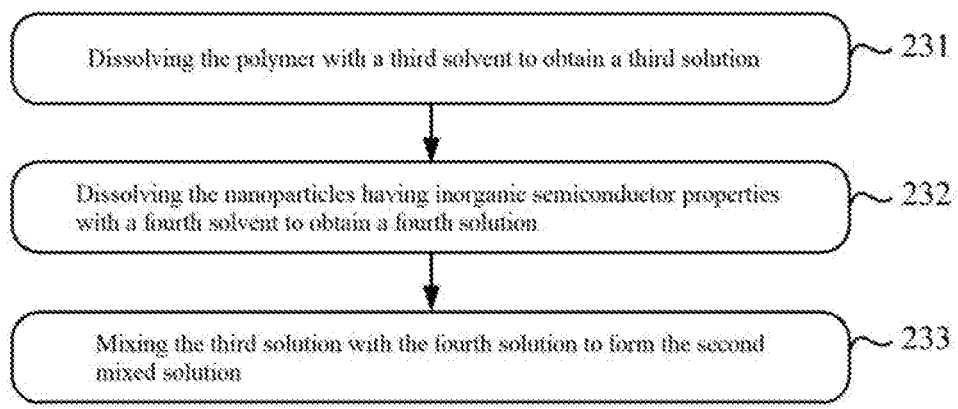
FIG. 5 is a flowchart of the specific method of step 23 in an exemplary embodiment of the disclosure.

Specifically, the polymer may be a polyelectrolyte polymer or a non-polyelectrolyte polymer, with reference to FIG. 5, the step of dissolving the polymer may include:

Step 231: dissolving the polymer with a third solvent to obtain a third solution.

The polymer is chain-like, and may be dissolved using an alcohol solvent or other solvents having similar properties, and the dissolution process may be accelerated by stirring, heating and the like. The third solvent can be selected according to the performances of the polymer selected. The solvent selected tends to have higher solubility for the selected polymer and is generally immiscible with the solvent used in preparing the quantum dot light-emitting layer. Preferably, a polar solvent can be selected to dissolve the polymer selected in this step.

Step 232: dissolving the nanoparticles having inorganic semiconductor properties with a fourth solvent to obtain a fourth solution.

The nanoparticles dissolved in this step may be the same as or different from the nanoparticles having inorganic semiconductor properties used in the step 21, and may specifically select the transition metal oxides such as zinc oxide and titanium oxide, and a preferable fourth solvent dissolving the above nanoparticles is a polar solvent.

Step 233: mixing the third solution with the fourth solution to form the second mixed solution.

In the mixing process, the above polymer and the nanoparticles may be sufficiently mixed by stirring, heating and the like to uniformly distribute the polymer and the nanoparticles in the second mixed solution. Preferably, the concentration of the polymer in the second mixed solution is less than 1 mg/ml, and the concentration of the nanoparticles is greater than or equal to 15 mg/ml and less than or equal to 25 mg/ml. At this concentration, the polymer can fully wrap around the nanoparticles, and since the conductivity of the polymer tends to be less than that of the nanoparticles, at this concentration, the influence of the polymer on the conductivity of a hole transport layer can be reduced, thereby ensuring the conductivity of the film layer while limiting the movement of the nanoparticles as much as possible, and ensuring the performance of the hole transport layer.

In the disclosure, the above concentration range is only described as a preferred exemplary embodiment, and is not limited to the use of mixed solutions satisfying the above concentration range, and the concentration range of the polymer may be adjusted according to actual production requirements and/or the concentration range of the nanoparticles may be adjusted. Thus, mixed solutions other than the above concentration range are used as long as a film layer having the properties of the polymer-winding-nanoparticles can be obtained.

In addition, in order to simplify the production process, a same solvent may be used to dissolve the polymer and the nanoparticles to form the second mixed solution. Specifically, a solvent capable of simultaneously dissolving the polymer and the nanoparticles may be used to dissolve the above substances, thereby ensuring that the polymer and the nanoparticles may coexist in the formed second solution, and the solvent is usually a polar solvent, thereby ensuring that the solvent is mutually immiscible with the non-polar solvent used in the preparation of the quantum dot light-emitting layer, and alleviating mutual solubility phenomenon between layers.

Step 24: depositing the second mixed solution on the other surface of the formed quantum dot light-emitting layer to form a hole transport layer containing the polymer and the nanoparticles.

Wherein the polymer wraps around the nanoparticles in the hole transport layer to block the mutual solubility between the hole transport layer and the quantum dot light-emitting layer. In a specific implementation process, the film formation can be accelerated by heating or the like. Since the polymer in the hole transport layer can wrap around the nanoparticles in the form of three-dimensional winding, the movement of the nanoparticles can be effectively restricted, thereby preventing the nanoparticles from sinking and leaking into the adjacent film layer due to gravity, alleviating the mutual solubility between the film layers, and further ensuring the light-emitting performance of the quantum dot light-emitting layer.

In addition, in the above process of forming the hole transport layer, the hole transport layer may contain not only the polymer and the nanoparticles, but also other organic or inorganic materials capable of enhancing polymer's ability to wrap around the nanoparticles or increasing the density of the net-shaped polymer, in order to improve the ability to limit the nanoparticles.

In the actual production process, the steps for manufacturing the QLED device may be performed by performing steps 21 and 22 first and then performing steps 23 and 24, or performing steps 23 and 24 first and then performing steps 21 and 22. Similarly, steps 21 and 23 can be performed simultaneously, and 22 and 24 are then performed, wherein the orders of 22 and 24 can be interchanged, as long as it is possible to achieve the deposition of the electron transport layer on one side and the hole transport layer on the other side of the quantum dot light-emitting layer.

When depositing the hole transport layer first and then depositing the electron transport layer, the hole transport layer is located below the quantum dot light-emitting layer and the electron transport layer is located above the quantum dot light-emitting layer. In the steps of the method, since the polymer in the hole transport layer three-dimensionally wraps around and winds the nanoparticles, the overall density of the hole transport layer is increased, and a gap of the contact face between the hole transport layer and the quantum dot light-emitting layer is reduced, thereby reducing, the leakage of the nanoparticles in the quantum dot light-emitting layer into the hole transport layer. As for the electron transport layer on the quantum dot light-emitting layer, the polyelectrolyte three-dimensionally winds and wraps around the nanoparticles, restricting the movement of the nanoparticles, and alleviating the leakage of the nanoparticles in the electron transport layer into the quantum dot light-emitting layer to some extent, and further alleviating the leakage or mutual solubility between the above film layers and ensuring the overall performance of the QLED device.

When depositing the electron transport layer first, and then depositing the hole transport layer the electron transport layer is located below the quantum dot light-emitting layer and the hole transport layer is located above the quantum dot light-emitting layer. In the steps of the method, since the polyelectrolyte in the electron transport layer three-dimensionally wraps around and winds the nanoparticles, the overall density of the electron transport layer is increased to make the contact face between the electron transport layer and the quantum dot light-emitting layer have a compact structure, thereby alleviating the leakage of the nanoparticles in the quantum dot light-emitting layer into the electron transport layer. As for the hole transport layer on the quantum dot light-emitting layer, since the polymer three-dimensionally winds and wraps around the nanoparticles, the movement of the nanoparticles is restricted, thereby alleviating the leakage of the nanoparticles in the hole transport layer into the quantum dot light-emitting layer to some extent, and further alleviating the leakage or mutual solubility between the above film layers and ensuring the overall performance of the QLED device.

The end group of the polyelectrolyte used in the process of depositing the electron transport layer in the present scheme has a dipole, which can be electrically connected to surface defects of the nanoparticles, thereby making up for the surface defect of the nanoparticles, reducing the density of the defect state of the electron transport layer and avoiding the interface quenching phenomenon. Moreover, since the polymer is chain-like, it can three-dimensionally wrap around the nanoparticles and limit the movement of the nanoparticles, thereby alleviating the leakage or mutual solubility between layers. Similarly, the polymer in the hole transport layer can also three-dimensionally wrap around the nanoparticles, thereby alleviating the leakage or mutual solubility between the layers. Since both the electron transport layer and the hole transport layer adjacent to the quantum dot light-emitting layer have a relatively dense structure, the nanoparticles are restricted to make them hard to move, and the nanoparticles located above are restricted by the chain polymer or blocked by the dense contact surface of the film layer below, thereby alleviating the leakage or mutual solubility between the layers.

Exemplary Embodiment 3

Figure 6A:
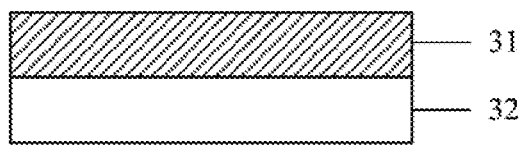
FIG. 6a is a first schematic structural diagram of film layers of a QLED device provided by an exemplary embodiment of the disclosure.

An exemplary embodiment of the disclosure provides a quantum dot light-emitting diode device, as shown in FIG. 6a, comprising: a quantum dot light-emitting layer 32, an electron transport layer 31 located on one surface of the quantum dot light-emitting layer 32, and the electron transport layer 31 contains a polyelectrolyte and nanoparticles having inorganic semiconductor properties, wherein end groups carried by the polyelectrolyte can fill a surface defect of the nanoparticles in the electron transport layer 31.

The above quantum dot light-emitting layer 32 is a film layer having a light-emitting function in the QLED device. In the operation state of the QLED device, an electron provided by a cathode and a hole provided by an anode are transported to the quantum dot light-emitting layer 32 through transport layers, and quantum dots in the quantum dot light-emitting layer 32 absorb photons to resulting in electron transition, thereby emitting light. Wherein, the quantum dots are specifically tiny semiconductor nanocrystals.

In the above structure, the end group of the polyelectrolyte in the electron transport layer 31 tends to have a dipole, and the end group can be electrically connected to the surface defects of the nanoparticles under the action of the electrode, thereby compensating for the surface defects of the nanoparticles, reducing the density of the defect state of the electron transport layer 31, alleviating the role of the nanoparticles in the electron transport layer 31 to capture electrons, avoiding interface quenching, and further improving the performance of the QLED device.

In the above QLED device, the polyelectrolyte in the electron transport layer is in the form of a net and wraps the nanoparticles in the electron transport layer to block the mutual solubility between the electron transport layer and the quantum dot light-emitting layer.

The structure of the above electron transport layer is shown in FIG. 6. The white hollow circle in the figure represents the nanoparticle M having inorganic semiconductor properties in the electron transport layer, and the black line wrapped around the nanoparticle M represents the polyelectrolyte N. The polyelectrolyte N specifically includes a main chain and a plurality of branches connected to the main chain, wherein the branches are not shown in the figure. Only the positional relationship among different substances is shown in the figure, which is not used to limit the amount of substances in the film layers. The end group of the polyelectrolyte in the electron transport layer is electrically connected to the surface defects of the nanoparticles to compensate for the surface defects of the nanoparticies, reducing the density of the defect state of the electron transport layer and avoiding the interface quenching phenomenon.

Figure 7A:
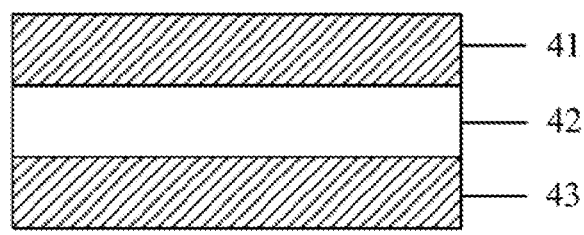
FIG. 7a is a second schematic structural diagram of film layers of a QLED device provided by an exemplary embodiment of the disclosure.

For the QLED device described above, with reference to FIG. 7a, it further includes a hole transport layer 43 located on the other surface of the quantum dot light-emitting layer 42, and the hole transport layer 43 comprises a polymer and nanoparticles having inorganic semiconductor properties.

Figure 6B:
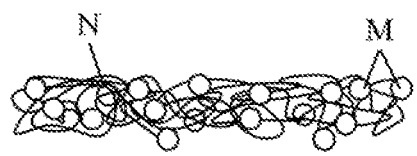
FIG. 6b is a schematic structural diagram of a transport layer provided by an exemplary embodiment of the disclosure.

The structure of the hole transport layer is shown in FIG. 6b, in which the white hollow circle represents the nanoparticle M having inorganic semiconductor properties in the hole transport layer, and the black line wrapped around the nanoparticle M represents the polymer N. The polymer N specifically includes a main chain and a plurality of branches connected to the main chain, wherein the branches are not shown in the figure. Only the positional relationship among different substances is shown in the figure, which is not used to limit the amount of substances in the film layers. The polymer in the hole transport layer is chain-like, and winds the nanoparticles to form a dense structure, thereby restricting the movement of the nanoparticles and alleviating the mutual solubility between the layers.

When the hole transport layer 43 is located below the quantum dot light-emitting layer 42, the polymer three-dimensionally wraps around the nanoparticles in the hole transport layer 43, and the overall density of the hole transport layer 43 is increased, and a gap of the contact face between the hole transport layer 43 and the quantum dot light-emitting layer 42 is reduced, thereby reducing the leakage of the nanoparticles in the quantum dot light-emitting layer 42 into the hole transport layer 43. As for the electron transport layer 41 on the quantum dot light-emitting layer 42, the polyelectrolyte three-dimensionally winds and wraps around the nanoparticles, restricting the movement of the nanoparticles, and alleviating the leakage of the nanoparticles in the electron transport layer 41 into the quantum dot light-emitting layer 42 to some extent, and further alleviating the leakage or mutual solubility between the above film layers, and ensuring the overall performance of the QLED device.

Figure 7B:
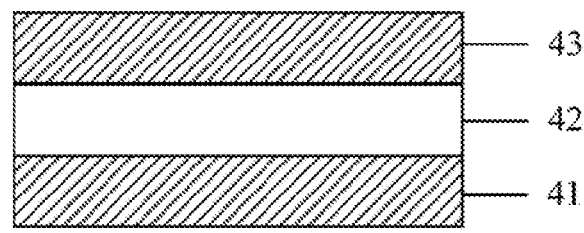
FIG. 7b is a third schematic structural diagram of film layers of a QLED device provided by an exemplary embodiment of the disclosure.

When the electron transport layer is located under the quantum dot light-emitting layer, with reference to FIG. 7b, since the polyelectrolyte in the electron transport layer 41 three-dimensionally wraps around and winds the nanoparticle, the overall density of the electron transport layer 41 is increased, and a gap of the contact face between the electron transport layer 41 and the quantum dot light-emitting layer 42 is reduced, thereby alleviating the leakage of the nanoparticles in the quantum dot light-emitting layer 42 into the electron transport layer 41. As for the hole transport layer 43 on the quantum dot light-emitting layer 42, the polymer three-dimensionally winds and wraps around the nanoparticles, restricting the movement of the nanoparticles, and alleviating the leakage of the nanoparticles in the hole transport layer 43 into the quantum dot light-emitting layer 42 to some extent, and further alleviating the leakage or mutual solubility between the above film layers and ensuring the overall performance of the QLED device.

Exemplary Embodiment 4

An exemplary embodiment of the disclosure provides a QLED apparatus including any one of the QLED devices mentioned above. The QLED device can be any products or components with display function, such as a mobile phone, a tablet computer, a television, a display, a notebook computer, a digital photo frame, a navigator, a smart wearable device, a virtual reality device, an augmented reality device and the like, and can also be used for lighting devices. Other components indispensable to the display device should be understood by a person skilled in the art, which are not described in detail herein, nor should be construed as a limitation to the disclosure.

The above description is only exemplary embodiments of the disclosure and is not intended to limit the disclosure. As for a person skilled in the art, there are various modifications and changes in the disclosure. Any equivalent modifications, equivalent substitutions, improvements and the like made within the spirit and principle of the disclosure should be included in the scope of the appended claims of the disclosure.

What is claimed is:

1. A method of manufacturing a quantum dot light-emitting diode device, comprising:
    dissolving a polyelectrolyte and nanoparticles having inorganic semiconductor properties to form a first mixed solution;
    depositing the first mixed solution on one surface of a formed quantum dot light-emitting layer to form an electron transport layer containing the polyelectrolyte and the nanoparticles;
    wherein end groups carried by at least a portion of the polyelectrolyte are capable of filling surface defects of the nanoparticles in the electron transport layer;
    wherein the dissolving a polyelectrolyte and nanoparticles having inorganic semiconductor properties to form a first mixed solution comprises the steps of:
    dissolving the polyelectrolyte with a first solvent to obtain a first solution;
    dissolving the nanoparticles having inorganic semiconductor properties with a second solvent to obtain a second solution; and
    mixing the first solution with the second solution to form the first mixed solution.

2. The method according to claim 1, wherein the method further comprises:
    dissolving a polymer and nanoparticles having inorganic semiconductor properties to form a second mixed solution;
    depositing the second mixed solution on the other surface of the formed quantum dot light-emitting layer to form a hole transport layer containing the polymer and the nanoparticles.

3. The method according to claim 1, wherein the first solvent is mutually miscible with the second solvent.

4. The method according to claim 1, wherein the first solvent and the second solvent are a same solvent.

5. The method according to claim 1, wherein
    the concentration of the polyelectrolyte in the first mixed solution is less than 1 mg/ml, and
    the concentration of the nanoparticles in the first mixed solution is greater than or equal to 15 mg/ml and less than or equal to 25 mg/ml.

6. The method according to claim 2, wherein the dissolving a polymer and nanoparticles having inorganic semiconductor properties to form a second mixed solution comprises the steps of:
    dissolving the polymer with a third solvent to obtain a third solution;
    dissolving the nanoparticles having inorganic semiconductor properties with a fourth solvent to obtain a fourth solution; and
    mixing the third solution with the fourth solution to form the second mixed solution.

7. The method according to claim 6, wherein the third solvent is mutually miscible with the fourth solvent.

8. The method according to claim 6, wherein the third solvent and the fourth solvent are a same solvent.

9. The method according to claim 6 wherein
    the concentration of the polymer in the second mixed solution is less than 1 mg/ml, and
    the concentration of the nanoparticles having inorganic semiconductor properties in the second mixed solution is greater than or equal to 15 mg/ml and less than or equal to 25 mg/ml.

* * * * *